(12) United States Patent
Cai et al.

(10) Patent No.: US 9,318,585 B1
(45) Date of Patent: Apr. 19, 2016

(54) SEMICONDUCTOR-ON-INSULATOR (SOI) LATERAL HETEROJUNCTION BIPOLAR TRANSISTOR HAVING A WIDE BAND GAP EMITTER/COLLECTOR WHICH ARE EPITAXIALLY GROWN

(71) Applicant: International Business Machines Corporation, Armonk, NY (US)

(72) Inventors: Jin Cai, Cortlandt Manor, NY (US); Kevin K. Chan, Staten Island, NY (US); Tak H. Ning, Yorktown Heights, NY (US); Jeng-Bang Yau, Yorktown Heights, NY (US); Joonah Yoon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/749,043

(22) Filed: Jun. 24, 2015

Related U.S. Application Data

(63) Continuation of application No. 14/709,579, filed on May 12, 2015.

(51) Int. Cl.
*H01L 29/737* (2006.01)
*H01L 29/06* (2006.01)
*H01L 29/08* (2006.01)

(52) U.S. Cl.
CPC .......... *H01L 29/737* (2013.01); *H01L 29/0642* (2013.01); *H01L 29/0817* (2013.01); *H01L 29/0821* (2013.01)

(58) Field of Classification Search
CPC .................... H01L 29/7371; H01L 29/66318; H01L 29/66242; H01L 29/7378; H01L 29/1004

USPC .......................................... 257/197
See application file for complete search history.

(56) References Cited

U.S. PATENT DOCUMENTS

| | | | |
|---|---|---|---|
| 6,362,065 B1 * | 3/2002 | Swanson | H01L 29/0817 257/198 |
| 6,756,278 B2 | 6/2004 | Yuki et al. | |
| 7,880,270 B2 | 2/2011 | Heinemann et al. | |
| 7,932,156 B2 | 4/2011 | Donkers et al. | |
| 8,441,084 B2 | 5/2013 | Cai et al. | |
| 8,557,670 B1 | 10/2013 | Cai et al. | |
| 2011/0115047 A1 | 5/2011 | Hebert et al. | |
| 2013/0256757 A1 | 10/2013 | Cai et al. | |
| 2014/0367745 A1 | 12/2014 | Cheng et al. | |
| 2014/0370683 A1 | 12/2014 | Cheng et al. | |

FOREIGN PATENT DOCUMENTS

KR 10-0644497 B1 11/2006

* cited by examiner

*Primary Examiner* — Walter H Swanson
(74) *Attorney, Agent, or Firm* — Scully, Scott, Murphy & Presser, P.C.; Louis J. Percello, Esq.

(57) ABSTRACT

A method of forming a semiconductor structure includes forming a first seed layer, a second seed layer and an intrinsic base spaced apart from each other and with the intrinsic base located between the first seed layer and the second seed layer on an insulator layer. The method further includes forming an emitter on the first seed layer and on a first vertical surface of the intrinsic base by epitaxially growing the emitter from the first seed layer and the first vertical surface of the intrinsic base, and forming a collector on the second seed layer and on a second vertical surface of the intrinsic base by epitaxially growing the collector from the second seed layer and the second vertical surface of the intrinsic base.

6 Claims, 4 Drawing Sheets

SEMICONDUCTOR-ON-INSULATOR (SOI) LATERAL HETEROJUNCTION BIPOLAR TRANSISTOR HAVING A WIDE BAND GAP EMITTER/COLLECTOR WHICH ARE EPITAXIALLY GROWN

BACKGROUND

The present application relates to a lateral heterojunction bipolar transistor (HBT) structure, and particularly to a lateral heterojunction bipolar transistor (HBT) including a wide band gap emitter/collector which are epitaxially grown and to methods of manufacturing the same.

Heterojunction bipolar transistors (HBTs) include a heterojunction, i.e., a junction of two semiconductor materials having different band gaps, which coincide with a p-n junction between the base and the emitter. The wider band gap of the emitter relative to the band gap of the base in an HBT increases the current gain relative to a bipolar junction transistor employing a same semiconductor material across the base and the emitter and having similar physical dimensions and doping profiles for the base and emitter.

However, there can be difficulties associated with the manufacturing of the HBTs. For instance, in circuit applications, designers want the ability of having a metal contact to the emitter conveniently located so that it can be connected to the metal wire for the emitter, and the metal contact to the collector conveniently located so that it can be connected to the metal wire for the collector. However, with conventional methods for manufacturing an HBT, there may be design limitations in connection with how far the metal contact for the emitter may be placed in relation to the intrinsic base and how far the metal contact for the collector may be placed in relation to the intrinsic base because the horizontal emitter/collector area formed in the trench isolation structure is typically too small to place the metal contacts arbitrarily away from the intrinsic base which, in turn, may leave limited manufacturing choices. In other words, the ability to epitaxially grow the emitter and the collector such that they horizontally fill up a trench isolation structure in conventional processes may be limited to horizontally filling only small trenches having widths no greater than 20 nm. Moreover, due also to the relatively small size of the horizontal emitter/collector area, the ability to electrical probe the emitter, the collector, and intrinsic base for testing the device may also be difficult.

SUMMARY

In accordance with an exemplary embodiment of the present application, a method of forming a semiconductor structure is provided. The method includes forming a first seed layer, a second seed layer and an intrinsic base spaced apart from each other, wherein the intrinsic base is located between the first seed layer and the second seed layer on an insulator layer. A first gap is located between the first seed layer and a first vertical surface of the intrinsic base, and a second gap is located between the second seed layer and a second vertical surface of the intrinsic base. The first seed layer, the second seed layer and the intrinsic base include a semiconductor material and have a doping of a first conductivity type.

The method further includes forming an emitter on the first seed layer, and in the first gap and on the first vertical surface of the intrinsic base by epitaxially growing the emitter from the first seed layer and the first vertical surface of the intrinsic base, and forming a collector on the second seed layer, and in the second gap and on the second vertical surface of the intrinsic base by epitaxially growing the collector from the second seed layer and the second vertical surface of the intrinsic base. The emitter and the collector have a doping of a second conductivity type opposite to the first conductivity type, and a first heterojunction exists between the emitter and the intrinsic base and a second heterojunction exists between the collector and the intrinsic base.

In accordance with an exemplary embodiment of the present application, a semiconductor structure is provided. The semiconductor structure of this embodiment includes a first seed layer and a second seed layer spaced apart from each other and on an insulator layer. The first seed layer and the second seed layer have a doping of a first conductivity type. An intrinsic base is located between the first seed layer and the second seed layer and on the insulator layer. The intrinsic base is spaced apart from the first seed layer by a first gap and is spaced apart from the second seed layer by a second gap, and the intrinsic base has a doping of the first conductivity type. The intrinsic base, the first seed layer and the second seed layer include a semiconductor material.

In addition, the semiconductor structure further includes an emitter covering the first seed layer, and located in the first gap and on a first vertical surface of the intrinsic base, a collector covering the second seed layer, and located in the second gap and on a second vertical surface of the intrinsic base that is opposite to the first vertical surface of the intrinsic base, in which the emitter and the collector include a semiconductor material and have a doping of a second conductivity type opposite to the first conductivity type, and an extrinsic base located on a top surface of the intrinsic base. The intrinsic base contacts the emitter, the collector and the extrinsic base, and the intrinsic base has an energy band gap less than an energy band gap of the emitter and an energy band gap of the collector.

In accordance with another exemplary embodiment, another method of forming a semiconductor structure is provided. The another method includes providing a semiconductor-on-insulator (SOI) substrate, patterning a top semiconductor layer of the SOI substrate to form a top semiconductor portion on an insulator layer of the SOI substrate, in which the top semiconductor portion is surrounded by a trench isolation structure, and the top semiconductor portion includes Si, Ge, SiGe, SiGeC, SiC, or a combination thereof, and has a doping of a first conductivity type.

In addition, the another method further includes sequentially forming a stack of an extrinsic base and an insulator cap on a top surface of the top semiconductor portion, in which the extrinsic base has a doping of the first conductivity type. Next, a first insulating spacer is formed laterally surrounding and contacting the extrinsic base and the insulator cap. A selective epitaxial growth (SEG) process is performed on the top semiconductor portion to form a first sacrificial epitaxy portion on a first region of the top semiconductor portion located on a first side of the extrinsic base, and a second sacrificial epitaxy portion on a second region of the top semiconductor portion located on a second side the extrinsic base located opposite to the first side of the extrinsic base, in which the first and second sacrificial epitaxy portions include Si, Ge, SiGe, SiGeC, SiC, or a combination thereof.

Further, the another method also includes performing an anisotrophic etching on the top semiconductor portion using the first and second sacrificial epitaxy portions as an etching mask to form a first seed layer, a second seed layer and an intrinsic base spaced apart from each other and with the intrinsic base located between the first seed layer and the second seed layer on and the insulator layer, and in which the stack of the extrinsic base and the insulator cap is located on a top surface of the intrinsic base. A first gap is located between the first seed layer and a first vertical surface of the intrinsic base, and a second gap is located between the second seed layer and a second vertical surface of the intrinsic base, and the first seed layer, the second seed layer and the intrinsic base include a semiconductor material and have a doping of the first conductivity type.

Moreover, the another method further includes removing residual portions of the first and second sacrificial epitaxy portions remaining after forming the first seed layer, the second seed layer and the intrinsic base, and performing an SEG process on all exposed portions of the first seed layer and an exposed surface of the first vertical surface of the intrinsic base to form an emitter as a continuous layer that covers and contacts the first vertical surface of the intrinsic base, covers and contacts the first seed layer, fills in the first gap, and covers and contacts a first sidewall of the trench isolation structure. The emitter includes Si, Ge, SiGe, SiGeC, SiC, or a combination thereof and has a doping of a second conductivity type opposite to the first conductivity type.

Also, the another method further includes performing an SEG process on all exposed portions of the second seed layer and an exposed surface of the second vertical surface of the intrinsic base to form a collector as a continuous layer that covers and contacts the second vertical surface of the intrinsic base, covers and contacts the second seed layer, fills in the second gap, and covers and contacts a second sidewall of the trench isolation structure. The collector includes Si, Ge, SiGe, SiGeC, SiC, or a combination thereof and has a doping of the second conductivity type, and the intrinsic base has an energy band gap less than an energy band gap of the emitter and an energy band gap of the collector.

In addition, the another method further includes forming a second insulating spacer laterally surrounding and contacting the first insulating spacer and contacting the emitter and the collector, and removing the insulator cap on the extrinsic base by an anisotropic etching process.

DETAILED DESCRIPTION

Figure 1:
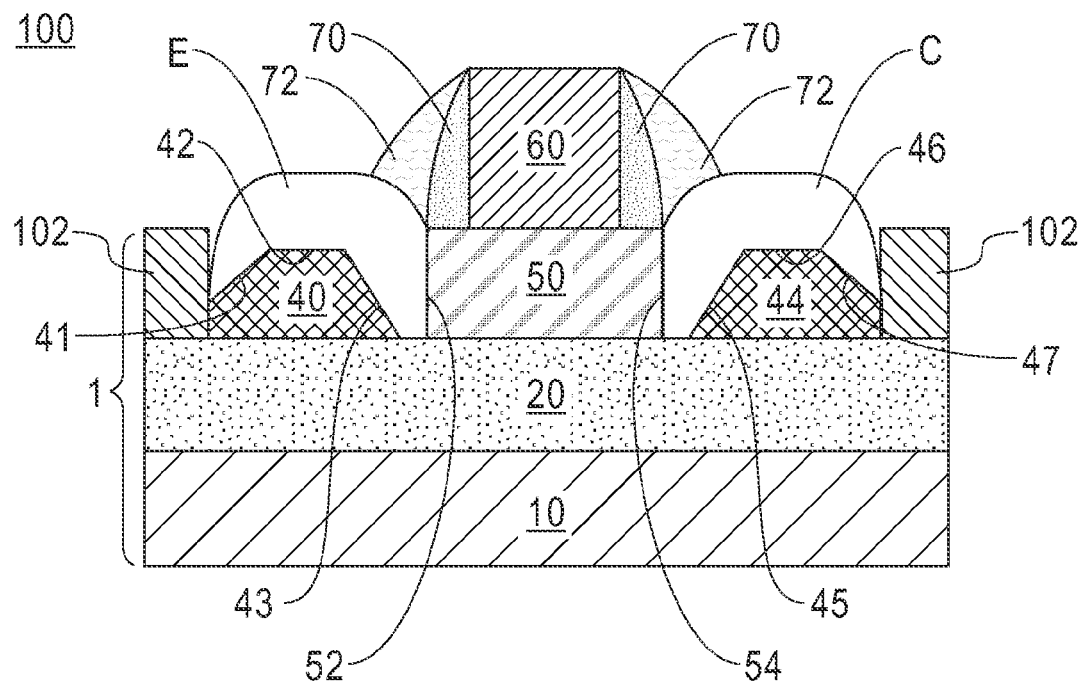
FIG. 1 is a vertical cross-sectional view of a heterojunction biopolar transistor (HBT) according to a first embodiment of the present application.

As stated above, the present application relates to a lateral heterojunction bipolar transistor (HBT) including a wide band gap emitter/collector which are epitaxially grown and to methods of manufacturing the same, which are now described in detail with accompanying figures. It is noted that like and corresponding elements mentioned herein and illustrated in the drawings are referred to by like reference numerals.

Referring first to FIG. 1, there is shown an SOI lateral HBT 100 ("hereinafter HBT 100") in accordance with a first embodiment of the present application. For illustration purposes, the HBT 100 of the present exemplary embodiment will be described herein as an npn transistor, having an n-type emitter, a p-type base and an n-type collector. However, it should be understood that the HBT 100 could contrarily comprise a pnp transistor with opposite doping types in other embodiments.

Figure 2:
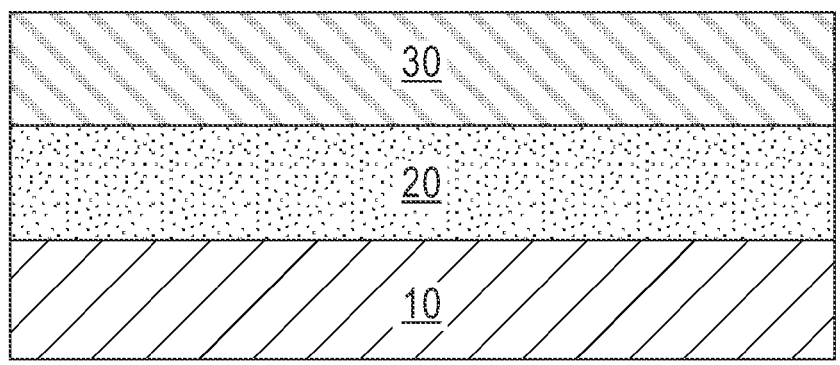
FIG. 2 is a vertical cross-sectional view of an exemplary semiconductor structure including a semiconductor-on-insulator (SOI) substrate that can be employed with an embodiment of the present application.

The HBT 100 exemplified in FIG. 1 includes, for example, a semiconductor-on-insulator (SOI) substrate 1. The SOI substrate 1 includes a handle substrate 10, an insulator layer 20 contacting a top surface of the handle substrate 10, and a top semiconductor layer 30 contacting a top surface of the insulator layer 20. It is noted that FIG. 1 does not show the top semiconductor layer 30 of the SOI substrate 1 because the SOI substrate 1 in these drawings was already processed to transform the top semiconductor layer 30 into a first seed layer 40, a second seed layer 44 and an intrinsic base 50. In any event, the SOI substrate 1, which includes the top semiconductor layer 30 prior to processing the SOI substrate 1, can be found in FIG. 2.

The handle substrate 10 may comprise a semiconductor material. The semiconductor material of the handle substrate 10 can include, but is not limited to, silicon (Si), germanium (Ge), silicon germanium (SiGe), silicon germanium carbide (SiGeC), silicon carbide (SiC), an III-V compound semiconductor, an II-VI compound semiconductor or any combinations thereof. Multilayers of semiconductor materials can also be used as the semiconductor material of the handle substrate 10. In one embodiment, the handle substrate 10 is comprised of silicon. In some embodiments, the handle substrate 10 is a non-semiconductor material including, for example, a dielectric material and/or a conductive material. In yet other embodiments, the handle substrate 10 can be omitted and a substrate including the insulator layer 20 and the top semiconductor layer 30 can be used in the present application.

The insulator layer 20 of the SOI substrate 1 may include a dielectric material such as, for example, silicon dioxide, silicon nitride, boron nitride or any other suitable insulating materials or combinations thereof. In an embodiment, the insulator layer 20 may be, for example, a buried oxide layer (BOX). The thickness of the insulator layer 20 can be, for example, from 5 nm to 1000 nm, and typically from 100 nm to 200 nm, although lesser and greater thicknesses can also be employed. The insulator layer 20 may, or may not, include multiple dielectric layers, e.g., a stack including at least a silicon dioxide layer and a silicon nitride layer.

The HBT 100 further includes, a first seed layer 40, a second seed layer 44, an intrinsic base 50 located between and spaced apart from the first seed layer 40 and the second seed layer 44, and a trench isolation structure 102 (e.g., a shallow trench isolation (STI)) which defines boundaries of the HBT 100 within the SOI substrate 1. As illustrated in FIG. 6 and discussed in further detail in connection with methods for fabricating the HBT 100, the first seed layer 40 is spaced apart from the intrinsic base 50 by a first gap 58 located between the first seed layer 40 and a first vertical sidewall 52 of the intrinsic base 50, and the second seed layer 44 is spaced apart from the intrinsic base 50 by a second gap 59 located between the second seed layer 44 and a second vertical sidewall 54 of the intrinsic base 50, such that the first seed layer 40, the second seed layer 44 and the intrinsic base 50 are spaced apart from each other as three separate regions on the insulator layer 20. The first seed layer 40, the second seed layer 44 and the intrinsic base 50 are formed by etching (e.g., a reactive ion etching (RIE) process) the top semiconductor portion 31 (formed by patterning the top semiconductor layer 30) of the SOI 1 such that the first seed layer 40, the second seed layer 44 and the intrinsic base 50 are all formed from the same layer (i.e., the top semiconductor portion 31) as will be explained in further detail in connection with methods for fabricating the HBT 100 illustrated in FIGS. 2-7.

In the present embodiment, the first seed layer 40, the second seed layer 44 and the intrinsic base 50 each have a p-type conductivity, but exemplary embodiments are not limited thereto. "P-type" refers to an impurity, i.e., dopant, that creates deficiencies of valence electrons. In other embodiments, the first seed layer 40, the second seed layer 44 and the intrinsic base 50 may instead alternatively each have an n-type conductivity. "N-type" refers to an impurity, i.e., dopant, that is added to an intrinsic semiconductor material that contributes free electrons to the intrinsic semiconductor material The first seed layer 40, the second seed layer 44 and the intrinsic base 50 are each formed from the top semiconductor portion 31, are each located within the trench isolation structure 102, and are each spaced apart from one another on the top surface of the insulator layer 20 (e.g. BOX).

The first seed layer 40, the second seed layer 44 and the intrinsic base 50 may each be composed of one of the semiconductor materials mentioned above for the handle substrate 10. For example, and in an embodiment, the first seed layer 40, the second seed layer 44 and the intrinsic base 50 may each include a semiconductor material such as, for example, Si, Ge, SiGe, SiGeC, SiC, or a combination thereof. In the present embodiment, the intrinsic base 50, the first seed layer 40 and the second seed layer 44 each have, for example, a p-type conductivity and include SiGe or Ge but exemplary embodiments are not limited thereto. Alternatively, and in another embodiment, the intrinsic base 50, the first seed layer 40 and the second seed layer 44 may each instead include an n-type conductivity and the emitter E and the collector C can include a p-type conductivity. Also, and in another embodiment, the intrinsic base 50, the first seed layer 40 and the second seed layer 44 may each be formed of a semiconductor material other than SiGe or Ge.

As noted above, and in the present embodiment, the first seed layer 40, the second seed layer 44, and the intrinsic base 50 are all formed from the same layer (i.e., the top semiconductor portion 31) and have the same conductivity type, doping concentrations and are formed of the same materials as each other. Alternatively, and in other embodiments, although the first seed layer 40, the second seed layer 44, and the intrinsic base 50 are still all formed from the same layer (i.e., the top semiconductor portion 31), the first seed layer 40, the second seed layer 44, and the intrinsic base 50 may instead later be altered to include different materials and doping concentrations from one another, so long they still each have the same conductivity type as one another.

The trench isolation structure 102 laterally surrounds the first seed layer 40, the second seed layer 44 and the intrinsic base 50. The trench isolation structure 102 in the present embodiment is a STI trench formed by, for example, conventional shallow trench isolation (STI) formation techniques. Moreover, the trench isolation structure 102 includes a dielectric material such as, for example, silicon dioxide, silicon nitride, and/or silicon oxynitride, or any other suitable isolation material or combination thereof.

In addition, the HBT 100 further includes an extrinsic base 60. The extrinsic base 60 may include a semiconductor material such as, for example, Si, Ge, SiGe, SiGeC, SiC, or a combination thereof. The doping concentration profile across the thickness of the extrinsic base 60 may be, for example, uniform or graded. Also, in embodiments in which the intrinsic base 50 and the extrinsic base 60 are composed of a same semiconductor material as each other, the energy band gap of the semiconductor material in the intrinsic base 50 may still be less than the energy band gap of the semiconductor material in the extrinsic base 60 by adjusting the content of constituent elements in the semiconductor material of the intrinsic base 50 and the extrinsic base 60. For example, and in an embodiment of the present application, the intrinsic base 50 may include SiGe with 50% Ge, and the extrinsic base 60 may include SiGe with 10% Ge such that the energy band gap of the SiGe in the intrinsic base 50 is less than the energy band gap of the SiGe in the extrinsic base 60.

In the present embodiment, the extrinsic base 60 has a p-type conductivity. Alternatively, and in an embodiment, the extrinsic base 60 may have an n-type conductivity. Also, in the present embodiment, the extrinsic base 60 can be more heavily doped than the intrinsic base 50. In some embodiments, the extrinsic base 60 also has an energy band gap which is larger than the energy band gap of the intrinsic base 50. Alternatively, and in an embodiment, the extrinsic base 60 is more heavily doped than the intrinsic base 50, and the extrinsic base 60 may have an energy band gap which is the same as the energy band gap of the intrinsic base 50.

As described in further detail below in the method for fabricating the HBT 100 illustrated in FIGS. 2-7, the extrinsic base 60 may be epitaxially grown on top of the intrinsic base 50, and a contact surface (e.g., a bottom surface) of the extrinsic base 60 may have an epitaxial relationship with a growth surface (e.g., a top surface) of the intrinsic base 50. As used herein, the expression "epitaxial relationship with" denotes that a contact surface of a first element has a same crystal orientation as the growth surface of the second element.

Further, the HBT 100 also includes a first insulating spacer 70 which surrounds, and contacts opposing vertical sidewalls of the extrinsic base 60 and which contacts an upper surface of the intrinsic base 50 and a first portion of the emitter E and a first portion of the collector C. The first insulating spacer 70 may include, for example, a dielectric material such as, for example, silicon oxide and/or silicon nitride. Additionally, the HBT 100 may further include a second insulating spacer 72 which surrounds, and contacts the first insulating spacer 70, and also contacts a second portion of the emitter E and a second portion of the collector C. The second insulating spacer 72 may include, for example, a dielectric material such as, for example, silicon oxide and/or silicon nitride.

In addition, the HBT 100 further includes an emitter E which is epitaxially grown from all exposed surfaces of the first seed layer 40 and an exposed surface of the first vertical sidewall 52 of the intrinsic base 50 as will be described in further detail hereinafter in connection with the methods for fabricating the HBT 100 of the present embodiment illustrated in FIGS. 2-7. For example, the emitter E formed by the above epitaxial process in the present embodiment is a continuous layer that covers and contacts the first vertical sidewall 52 of the intrinsic base 50, covers and contacts the first sidewall 41 of the first seed layer 40, the top surface 42 of the first seed layer 40, the second sidewall 43 of the first seed layer 40, fills in the first gap 58 between the first seed layer 40 and the first vertical sidewall 52 of the intrinsic base 50, and covers and contacts a first sidewall of the trench isolation structure 102. In addition, an upper surface of the emitter E may also extend higher than an uppermost surface of the intrinsic base 50 and an uppermost surface of the trench isolation structure 102, and the emitter E may also contact a first lower portion of the first insulating spacer 70 and a first lower portion of the second insulating spacer 72. The expression "continuous layer" as used herein refers to an unbroken layer.

Further, the HBT 100 also includes a collector C which is epitaxially grown from all exposed surfaces of the second seed layer 44 and an exposed surface of the second vertical sidewall 54 of the intrinsic base 50 as will be described in further detail hereinafter in connection with the methods for fabricating the HBT 100 of the present embodiment illustrated in FIGS. 2-7. For example, the collector C formed by the above epitaxial process in the present embodiment is a continuous layer that covers and contacts the second vertical sidewall 54 of the intrinsic base 50, covers and contacts the first sidewall 45 of the second seed layer 44, the top surface 46 of the second seed layer 44, the second sidewall 47 of the second seed layer 44, fills in the second gap 59 between the second seed layer 44 and the second vertical sidewall 54 of the intrinsic base 50, and covers and contacts a second sidewall of the trench isolation structure 102. In addition, an upper surface of the collector C may also extend higher than an uppermost surface of the intrinsic base 50 and an uppermost surface of the trench isolation structure 102, and the collector C may also contact a second lower portion of the first insulating spacer 70 and a second lower portion of the second insulating spacer 72.

The emitter E and the collector C may include any semiconductor material so long as the energy band gap of the semiconductor material used for the emitter E and the collector C are larger than the energy band gap of the intrinsic base 50. For example, the emitter E and the collector C may include a semiconductor material such as Si, Ge, SiGe, SiGeC, SiC, or a combination thereof. A portion of the emitter E located in the first gap 58 and a portion of the collector C located in the second gap 59 each make contact with the intrinsic base 50 and by the intrinsic base 50 having a smaller energy band gap than the energy band gaps of the emitter E and the collector C, a first heterojunction may therefore be created between the emitter E and the intrinsic base 50, and a second heterojunction may therefore be created between the collector C and the intrinsic base 50. The doping concentration profile across the thickness of the intrinsic base 50 may be, for example, uniform or graded. In the present embodiment, the doping concentrations of each of the emitter E and the collector C are greater than the doping concentration of the intrinsic base 50, but exemplary embodiments are not limited thereto. For example, and in other embodiments, the doping concentration of the intrinsic base 50 may be greater than the doping concentrations of the emitter E and the collector C, so long as the energy band gap of the intrinsic base 50 is smaller than the energy band gaps of the emitter E and the collector C.

Figure 1A:
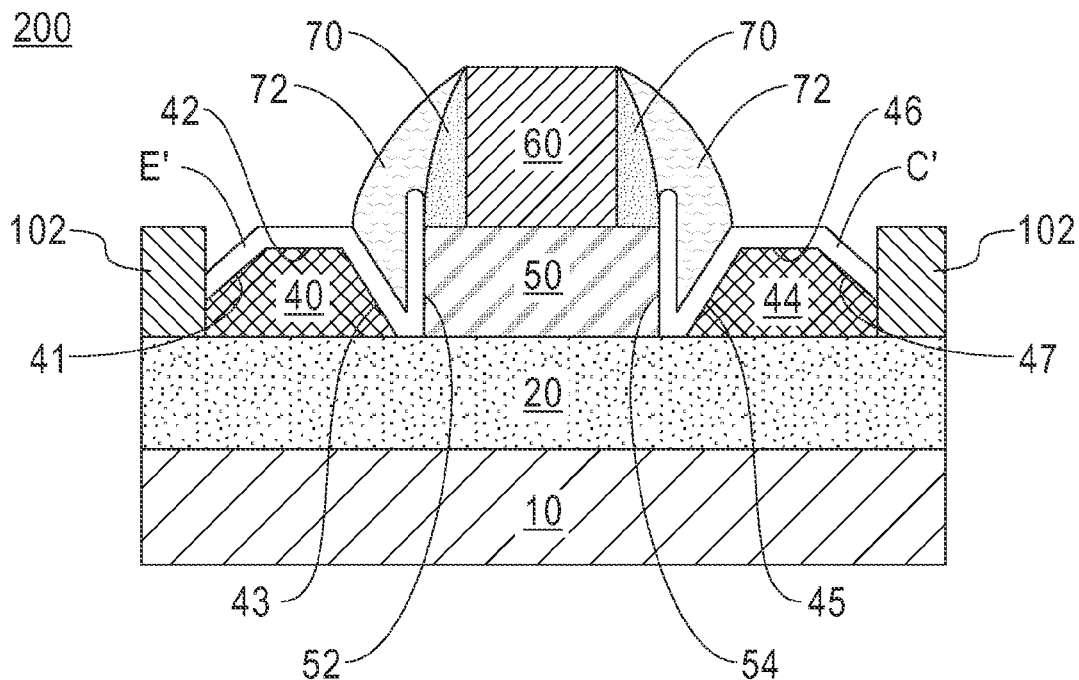
FIG. 1A is a vertical cross-sectional view of a heterojunction biopolar transistor (HBT) according to a second embodiment of the present application.

In the present embodiment, the emitter E and the collector C may be relatively thick (e.g., greater than 10 nm) as shown in FIG. 1 but exemplary embodiments are not limited thereto. Alternatively, in another embodiment such as illustrated in FIG. 1A, the emitter E' and the collector C' may be relatively thin (e.g., less than 5 nm). The thickness range for each of the emitter E and the collector C can be, for example, from 2 nm-100 nm. It is noted that the thicknesses for the emitter E and the collector C are not limited to any particular amount but rather may be adjusted depending upon the particular application for the semiconductor device.

In the present embodiment, the first seed layer 40, the second seed layer 44, the emitter E and the collector C together horizontally fill the trench isolation structure 102. In other words, by epitaxially growing the emitter E from the first seed layer 40 and the first vertical sidewall 52 of the intrinsic base 50, the emitter E is able to extend from the first vertical sidewall 52 of the intrinsic base 50 all the way to a first sidewall of the trench isolation structure, and by epitaxially growing the collector C from the second seed layer 44 and the second vertical sidewall 54 of the intrinsic base 50, the collector C is able to extend from the second vertical sidewall 54 of the intrinsic base 50 all the way to a second sidewall of the trench isolation structure 102 to thereby horizontally fill the trench isolation structure 102. In addition, and unlike in the conventional art HBT fabrication processes in which the epitaxially grown emitter and collector can only horizontally fill trenches having a width of no greater than 20 nm, with methods of exemplary embodiments of the present application, there is essentially no limit to the size of the trenches of a trench isolation structure which may be horizontally filled by the combination of the first seed layer 40, the emitter E, the second seed layer 44 and the collector C of exemplary embodiments of the present application.

Reference is now made to FIGS. 2-7, which illustrate a method for fabricating the HBT 100 shown in FIG. 1 according to the first embodiment of the present application. Specifically, and referring to FIG. 2, an SOI substrate 1 is first provided. In the present embodiment, the SOI substrate 1 includes, for example, the handle substrate 10, the insulator layer 20 (e.g., BOX) contacting a top surface of the handle substrate 10, and a top semiconductor layer 30 contacting the top surface of the insulator layer 20.

The SOI substrate 1 may be fabricated using techniques well known to those skilled in the art. For example, the SOI substrate 1 may be formed by conventional processes including, but not limited to, Separation by Implanted Oxygen (SIMOX) process, which employs high dose ion implantation of oxygen and high temperature annealing to form insulator layer 20 (e.g., BOX layer) in a bulk wafer, or wafer bonding. The SOI substrate 1 may also be formed using other processes. The method of fabricating the SOI substrate 1 is not critical to the present application.

In one embodiment and as mentioned above, the handle substrate 10 may include any semiconductor material. In one example, the handle substrate 10 may include Si, Ge, SiGe, SiGeC, SiC, or a combination thereof. In another example, the handle substrate 10 may alternatively include a non-semiconductor material such as a dielectric material and/or conductive material. Insulator layer 20 may include, for example, a dielectric material such as, for example, silicon dioxide, silicon nitride, boron nitride or any other suitable insulating material or combination thereof.

The top semiconductor layer 30 may include any semiconductor material as mentioned above for the handle substrate 10. In one embodiment, the semiconductor material that provides the top semiconductor layer 30 can be a same semiconductor material as that which provides the handle substrate 10. In another embodiment, the semiconductor material that provides the top semiconductor layer 30 can be a different semiconductor material than that which provides the handle substrate 10. In one example, the top semiconductor layer 30 may include a silicon containing semiconductor material such as Si, SiGe, SiGeC, SiC, or a combination thereof. Non-silicon containing semiconductor materials such as, for example, Ge, an III-V compound semiconductor and/or an II-VI compound semiconductor may also be used as the semiconductor material that provides the top semiconductor layer 30. In some embodiments, the top semiconductor layer 30 includes a crystalline semiconductor material such as, for example, single crystal silicon. In one example, the thickness of the top semiconductor layer 30 of the SOI substrate 1 can be from 5 nm to 500 nm. In another example, the thickness of the top semiconductor layer 30 of the SOI substrate 1 can be from 10 nm to 100 nm. Other thicknesses that are lesser than, or greater than, the aforementioned thicknesses ranges may also be used as the thickness of the top semiconductor layer 30.

Figure 3:
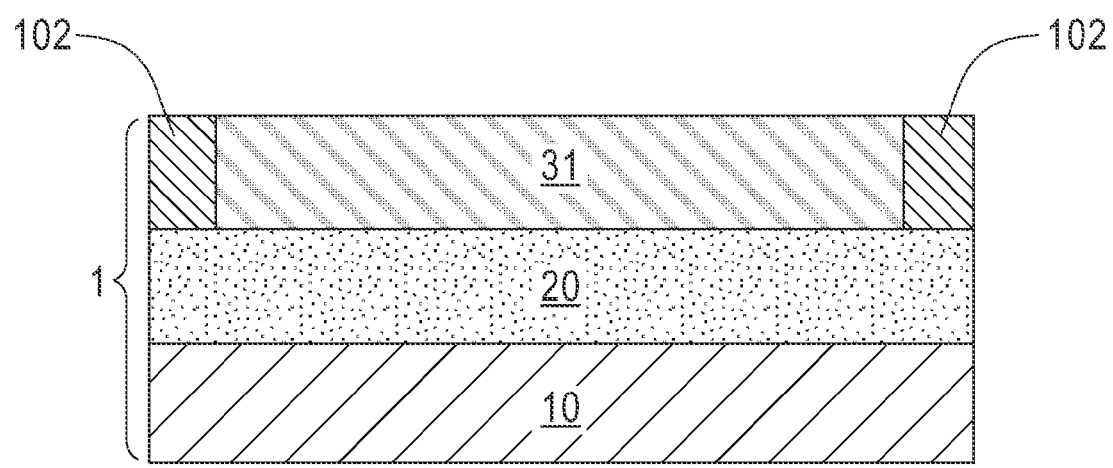
FIG. 3 is a vertical cross-sectional view of the exemplary semiconductor structure of FIG. 2 after forming a trench isolation structure in a top semiconductor layer of the SOI substrate according to the first embodiment.

Next, referring to FIG. 3, the top semiconductor layer 30 can be processed to include a trench isolation structure 102. In one embodiment, the trench isolation structure 102 can be formed utilizing a trench isolation process. The trench isolation process may include, for example, patterning the top semiconductor layer 30 by lithography and etching, to provide a trench in the top semiconductor layer 30. The trench is then filled with a trench dielectric material such as, for example, silicon dioxide. A planarization process can follow the trench fill. The trench isolation structure 102 that is formed extends completely through the top semiconductor layer 30, stopping on a top surface of the insulator layer 20. The trench isolation structure 102 also laterally surrounds and contacts an unetched region (i.e., a remaining portion) of the top semiconductor layer 30, which is herein referred to as a top semiconductor portion 31.

In one embodiment of the present application, the top semiconductor portion 31 includes SiGe or Ge and is doped with an electrical dopant having a p-type conductivity type such as, for example, boron (B), aluminum (Al), gallium (Ga), and/or indium (In). In such an embodiment, the top semiconductor portion 31 has doping of a p-conductivity type. Alternatively, the top semiconductor portion 31 may be doped with an electrical dopant having an n-type conductivity type such as, for example, phosphorus (P), arsenide (As), and/or antimony (Sb). In such an embodiment, the top semiconductor portion 31 has doping of an n-conductivity type. In other embodiments of the present application, the top semiconductor portion 31 may include semiconductor materials other than SiGe or Ge.

The dopants that provide the conductivity type to the top semiconductor portion 31 can be provided by utilizing one of ion implantation and gas phase doping. Alternatively, and in an embodiment of the present application, the top semiconductor layer 30 may have been doped prior to forming the top semiconductor portion 31.

Figure 4:
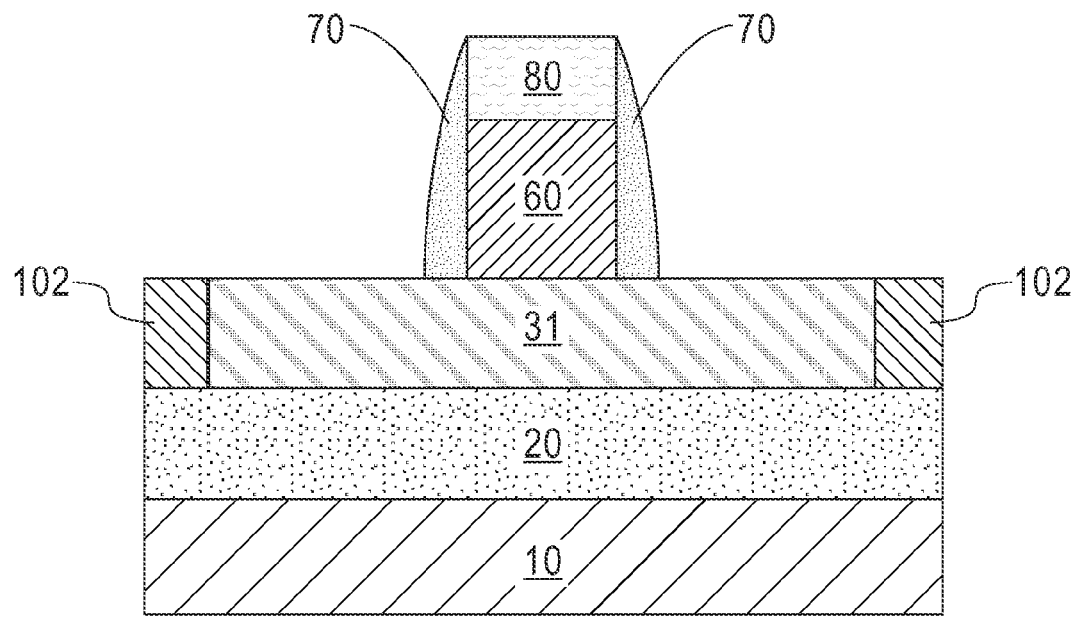
FIG. 4 is a vertical cross-sectional view of the exemplary semiconductor structure of FIG. 3 after forming a stack of an extrinsic base and an insulator cap on a top surface of the top semiconductor portion and a first insulating spacer surrounding the stack of the extrinsic base and the insulator cap.

Next, referring to FIG. 4, a semiconductor material layer (not shown) and a dielectric material layer (not shown) are sequentially deposited over the top surface of the top semiconductor portion 31 and, for example, lithographically patterned to form a stack, from bottom to top, of an extrinsic base 60 and an insulator cap 80. In the present embodiment, an epitaxial growth process, such, as for example, a selective epitaxial growth (SEG) process is performed to epitaxially grow the extrinsic base 60 from the top surface (growth surface) of the top semiconductor portion 31. For example, in the present embodiment, a semiconductor material layer including a semiconductor material such as, for example, Si, Ge, SiGe, SiGeC, SiC, or a combination thereof is epitaxially grown from the top surface (growth surface) of the top semiconductor portion 31 using an SEG process to form an extrinsic base layer (not shown). Alternatively, in other embodiments, extrinsic base 60 may be formed by other methods besides epitaxial growth.

The extrinsic base layer may be doped in-situ during the epitaxial growth process or, alternatively, by a subsequent ion implantation process after growth of an intrinsic semiconductor material. In the present embodiment, the extrinsic base layer is doped with a p-type conductivity. Alternatively, in an embodiment, the extrinsic base layer may include a semiconductor material having an n-type conductivity in the case of a pnp HBT.

Also, in the present embodiment, the extrinsic base layer can be more heavily doped than the top semiconductor portion 31. In some embodiments, the extrinsic base layer also has an energy band gap which is larger than the energy band gap of the top semiconductor portion 31. Alternatively, and in an embodiment, the extrinsic base layer is more heavily doped than the top semiconductor portion 31, and the extrinsic base layer may have an energy band gap which is the same as the energy band gap of the top semiconductor portion 31. Typically, the extrinsic base layer has a higher dopant concentration than the top semiconductor portion 31. The thickness of the extrinsic base layer can be from 50 nm to 300 nm, although lesser and greater thicknesses can also be employed.

The dielectric material layer includes a dielectric material such as, for example, silicon oxide and/or silicon nitride. The dielectric material layer can be deposited, for example, by chemical vapor deposition such as low pressure chemical vapor deposition (LPCVD) or plasma enhanced chemical vapor deposition (PECVD).

The dielectric material layer and the extrinsic base layer may then be patterned using conventional lithography and etching processes to form the stack of the extrinsic base 60 and the insulator cap 80 as shown, for example, in FIG. 4. The stack of the extrinsic base 60 and the insulator cap 80 is located on the top surface of the top semiconductor portion 31 so that two end portions of the stack of the extrinsic base 60 and the insulator cap 80 overlie the trench isolation structure 102. A first region of the top semiconductor portion 31 is exposed on a first side of the stack of the extrinsic base 60 and the insulator cap 80, and a second region of the top semiconductor portion 31 is exposed on a second side of the stack of the extrinsic base 60 and the insulator cap 80 which opposite to the first side of the stack of the extrinsic base 60 and the insulator cap 80.

Next, a first insulating spacer 70 is formed, for example, by depositing another dielectric material layer and anisotropically etching that dielectric material layer. The first insulating spacer 70 can include a different dielectric material than the dielectric material of the insulator cap 80. For example, the first insulating spacer 70 can include silicon oxide, and the insulator cap 80 can include silicon nitride. The first insulating spacer 70 laterally surrounds, and contacts the sidewalls of, the stack of the extrinsic base 60 and the insulator cap 80.

Figure 5:
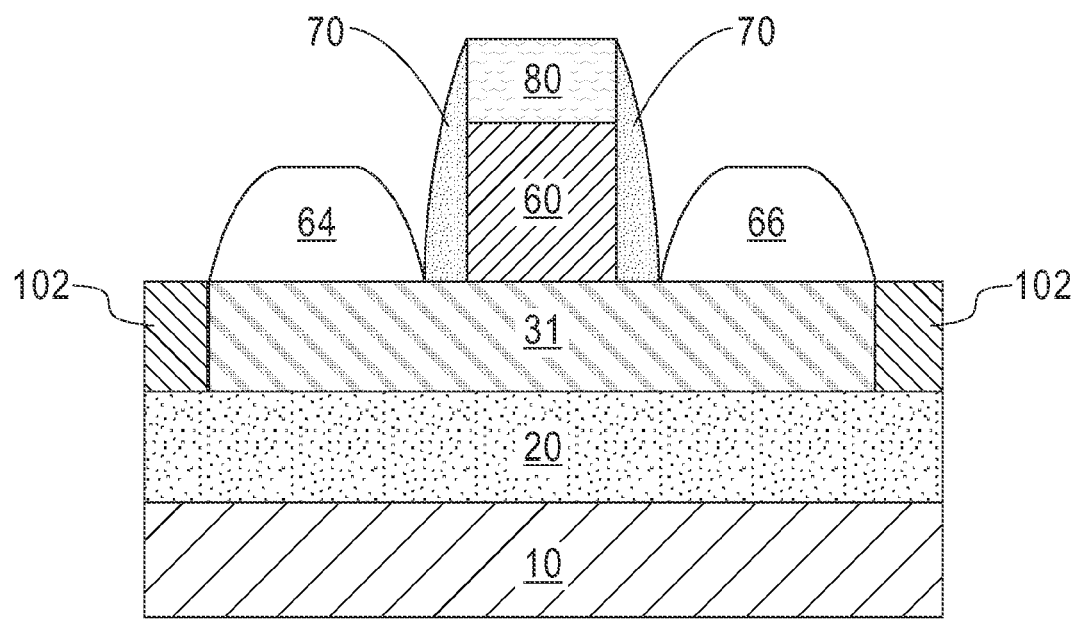
FIG. 5 is a vertical cross-sectional view of the exemplary semiconductor structure of FIG. 4 after a first sacrificial epitaxy portion and a second sacrificial epitaxy portion have been formed on the top surface of the top semiconductor portion using a selective epitaxial growth process.
Figure 6:
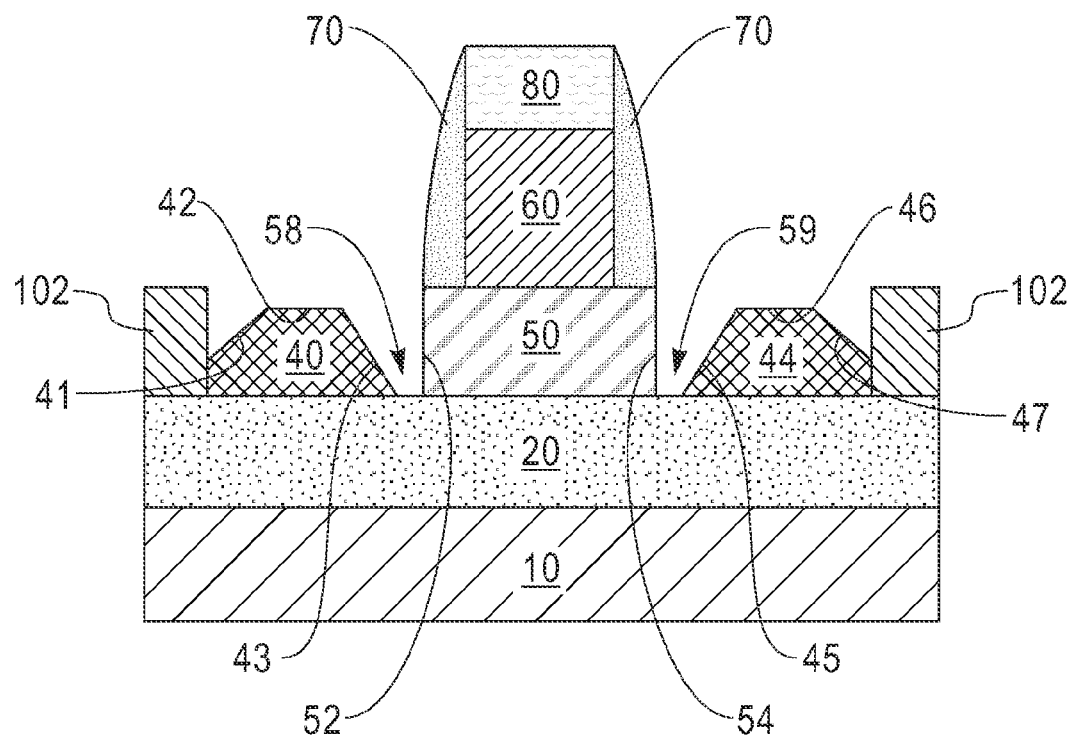
FIG. 6 is a vertical cross-sectional view of the exemplary semiconductor structure of FIG. 5 after etching the top semiconductor portion using the first and second sacrificial epitaxy portions as an etch mask to form a first seed layer, a second seed layer and an intrinsic base spaced apart from each other with the intrinsic base located between the first seed layer and the second seed layer on the insulator layer.

Further, as shown in FIG. 5, an epitaxial growth process such, as for example, a SEG process is then performed on an exposed surface of top semiconductor portion 31 such that the top semiconductor portion 31 operates as a seed for growing epitaxy portions, for example, a first sacrificial epitaxy portion 64 on the first region of a top surface of the top semiconductor portion 31 located on the first side of the extrinsic base 60, and a second sacrificial epitaxy portion 66 on the second region of the top surface of the top semiconductor portion 31 located on a second side of the extrinsic base 60 that is opposite to the first side of the extrinsic base 60. In addition, the first sacrificial epitaxy portion 64 on the first region of the top semiconductor portion 31 also contacts an upper surface of the first sidewall of the trench isolation structure 102 and contacts a lower portion of a first lateral surface of the first insulating spacer 70, and the second sacrificial epitaxy portion 66 on the second region of the top semiconductor portion 31 also contacts an upper surface of the second sidewall of the trench isolation structure 102 and contacts a lower portion of a second lateral surface of the first insulating spacer 70. In the present embodiment, the first and second sacrificial epitaxy portions 64, 66 are formed of a silicon containing semiconductor such as, for example, Si, SiGe, SiGeC, SiC, or a combination thereof. However exemplary embodiments are not limited thereto but rather the first and second sacrificial epitaxy portions 64, 66 may be formed of any semiconductor material that can be used in a selective epitaxial process. In some embodiments, the thicknesses of each of the first and second sacrificial epitaxy portions 64, 66 can be, for example, from 5 nm-200 nm but exemplary embodiments are not limited thereto.

Further, as shown in FIG. 6, an etching process such as, for example, a uniform reactive ion etching (RIE) process at a constant rate is performed using the first and second sacrificial epitaxy portions 64, 66 as an etching mask to etch all the way down through the top semiconductor portion 31 and stopping on the insulator layer 20 (e.g., BOX), thereby exposing portions of the top surface of the insulator layer 20 and also forming a first seed layer 40, a second seed layer 44 and an intrinsic base 50 which are spaced apart from each other and are located on the insulator layer 20. The intrinsic base 50 is located in between the first seed layer 40 and the second seed layer 44. In the present embodiment, the first seed layer 40, the second seed layer 44 and the intrinsic base 50 are all formed from the top semiconductor portion 31. The first seed layer 40 is spaced apart from the intrinsic base 50 by a first gap 58 located between the first seed layer 40 and the first vertical sidewall 52 of the intrinsic base 50, and the first gap 58 exposes a first portion of the top surface of the insulator layer 20. In addition, the second seed layer 44 is spaced apart from the intrinsic base 50 by a second gap 59 located between the second seed layer 44 and the second vertical sidewall 54 of the intrinsic base 50, and the second gap 59 exposes a second portion of the top surface of the insulator layer 20.

In the present embodiment, the use of the first and second sacrificial epitaxy portions 64, 66 allows for the providing of a first gap 58 having, for example, a V-shape that is located between the intrinsic base 50 and the first seed layer 40 and a second gap 59 having, for example, a V-shape that is located between the second seed layer 44 and the intrinsic base 50. The second sidewall 43 of the first seed layer 40, the first vertical sidewall 52 of the intrinsic base 50 and the first portion of the top surface insulator layer 20 define the first gap 58 having a V-shape, and the first sidewall 45 of the second seed layer 44, the second vertical sidewall 54 of the intrinsic base 50 and the second portion of the top surface of the insulator layer 20 define the second gap 59 having a V-shape. However, exemplary embodiments of the present application are not limited to the above-mentioned shape for the first gap 58 and the second gap 59.

In the present embodiment, the first and second sacrificial epitaxy portions 64, 66 may function as a self-aligned etching mask such that no exposure or lithography processes are necessary. Moreover, and in the present embodiment, essentially all of the first and second sacrificial epitaxy portions 64, 66 are removed by a conventional process known in the art after forming the first seed layer 40, the second seed layer 44 and the intrinsic base 50. However, exemplary embodiments are not limited thereto but rather in another embodiment, some residual portions of the first and second sacrificial epitaxy portions 64, 66 may still remain on the first seed layer 40 and the second seed layer 44 after the removal process.

In an embodiment, the intrinsic base 50 includes, for example, SiGe and the extrinsic base 60 includes Si. In another example, the intrinsic base 50 may include SiGe with 50% Ge, and the extrinsic base 60 includes SiGe with 10% Ge. In some embodiments, the extrinsic base 60 is more heavily doped than the intrinsic base 50, and the extrinsic base 60 may have an energy band gap which is the same as the energy band gap of the intrinsic base 50. Also, the doping concentration of the extrinsic base 60 may be greater than the doping concentration of the intrinsic base 50 in the present exemplary embodiment but exemplary embodiments are not limited thereto. For example, and in an alternative embodiment of the present application, the extrinsic base 60 and the intrinsic base 50 may have the same doping concentration as each other.

Figure 7:
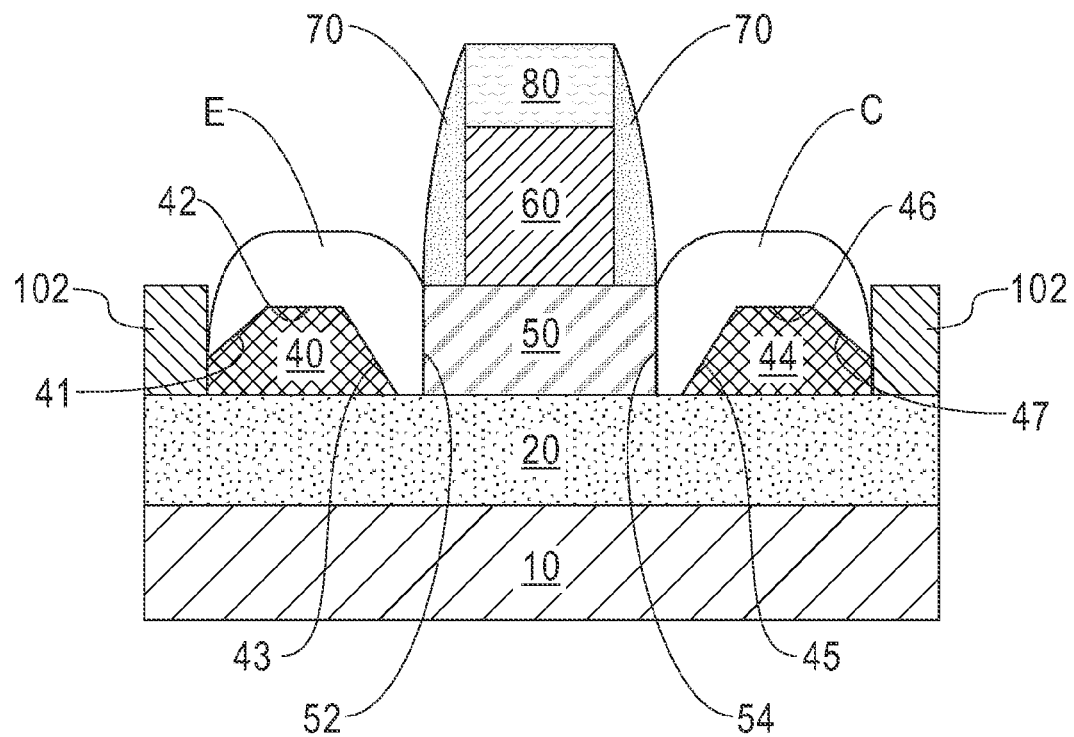
FIG. 7 is a vertical cross-sectional view of the exemplary semiconductor structure of FIG. 6 after performing an epitaxial growth process in which all of the exposed surfaces of the first seed layer and an exposed surface of a first vertical sidewall of the intrinsic base together act as a seed to grow an emitter on the first seed layer, the first vertical sidewall of the intrinsic base and fill in a first gap between the intrinsic base and the first seed layer with the emitter, and in which all of the exposed surfaces of the second seed layer and an exposed surface of a second vertical sidewall of the intrinsic base together act as a seed to grow a collector on the second seed layer, the second vertical sidewall of the intrinsic base and to fill in a second gap between the intrinsic base and the second seed layer with the collector.

Next, as shown in FIG. 7, an epitaxial growth process, such as, for example, an SEG process, is performed in which all of the exposed surfaces of the first seed layer 40 (i.e., the first sidewall 41, the top surface 42 and the second sidewall 43 of the first seed layer 40) and the exposed surface of the first vertical sidewall 52 of the intrinsic base 50 together operate as a seed for growing the emitter E from the first seed layer 40 and the first vertical sidewall 52 of the intrinsic base 50, and in which all of the exposed surfaces of the second seed layer 44 (i.e., the first sidewall 45, the top surface 46 and the second sidewall 47 of the second seed layer 44) and the exposed surface of the second vertical sidewall 54 of the intrinsic base 50 together operate as a seed for growing the collector C from the second seed layer 44 and the second vertical sidewall 54 of the intrinsic base 50.

The emitter E formed by the above SEG process in the present embodiment is a continuous layer that covers and contacts the first vertical sidewall 52 of the intrinsic base, covers and contacts the first sidewall 41 of the first seed layer 40, the top surface 42 of the first seed layer 40, the second sidewall 43 of the first seed layer 40, fills in the first gap 58 between the first seed layer 40 and the first vertical sidewall 52 of the intrinsic base 50, and covers and contacts a first sidewall of the trench isolation structure 102. In addition, an upper surface of the emitter E may also extend higher than an uppermost surface of the intrinsic base 50 and an uppermost surface of the trench isolation structure 102, and the emitter E may also contact a first lower portion of the first insulating spacer 70 and a first lower portion of the second insulating spacer 72.

Further, the collector C formed by the above SEG process in the present embodiment is a continuous layer that covers and contacts the second vertical sidewall 54 of the intrinsic base 50, covers and contacts the first sidewall 45 of the second seed layer 44, the top surface 46 of the second seed layer 44, the second sidewall 47 of the second seed layer 44, fills in the second gap 59 between the second seed layer 44 and the second vertical sidewall 54 of the intrinsic base 50, and covers and contacts a second sidewall of the trench isolation structure 102. In addition, an upper surface of the collector C may also extend higher than an uppermost surface of the intrinsic base 50 and an uppermost surface of the trench isolation structure 102, and the collector C may also contact a second lower portion of the first insulating spacer 70 and a second lower portion of the second insulating spacer 72.

The emitter E and the collector C may be doped in-situ during the epitaxial growth process or, alternatively, by a subsequent ion implantation process after growth of an emitter E and collector C semiconductor material. In the present embodiment, the emitter E and the collector C are doped with an n-type conductivity and include Si, SiGe or a combination thereof as the semiconductor material, but exemplary embodiments are not limited thereto. Other semiconductor materials besides Si, and/or SiGe can be used in providing the emitter E and the collector C of the present application so long as the energy band gap of the semiconductor material that provides the emitter E and the collector C are greater than the band gap of the semiconductor materials that provides the intrinsic base 50. Alternatively, and in other embodiments, the emitter E and the collector C may have a p-type conductive if a pnp heterojunction bipolar transistor is desired.

Next, a second insulating spacer 72 is formed by, for example, depositing another dielectric material layer (not shown) and anisotrophically etching (e.g., an RIE process) the dielectric material layer to form the second insulating spacer 72 in contact with a portion of the emitter E, a portion of the collector C, and surrounding and in direct physical contact with the first insulating spacer 70.

After forming the second insulating spacer 72, the insulator cap 80 located on the extrinsic base 60 is then removed by, for example, an anisotrophic etching process such as an RIE process to form the HBT 100 of FIG. 1 of the first embodiment of the present application.

Optionally, self-aligned metal semiconductor alloy contacts (not shown) can be formed on the exposed emitter E, collector C and extrinsic base 60 surfaces by utilizing a conventional self-aligned metal semiconductor alloy contact formation process that includes, for example, deposition of a metal such as nickel (Ni), platinum (Pt), cobalt (Co), or titanium (Ti), and annealing. In embodiments in which the emitter E and collector C are both composed of silicon, a metal silicide contact may form. Thereafter, unreacted metal is removed, by etching selective to the metal semiconductor alloy contact leaving the metal semiconductor alloy contact in place.

Next, metal wires (not shown) may then be formed to contact the emitter E, the collector C and the intrinsic base 50, respectively.

Now referring to FIG. 1A, there is illustrated an HBT 200 in accordance with a second embodiment of the present application. The same reference numerals will be used in this embodiment in the detailed description and the drawings to refer to the same elements in common with the first embodiment. Moreover, for the sake of brevity, elements of the first embodiment in common with the present embodiment will not be described. It is noted that the HBT 200 of the present embodiment is essentially the same as the HBT 100 of the first embodiment, except that the emitter E and the collector C of the HBT 100 of the first embodiment are formed thicker than emitter E' and the collector C' of the HBT 200 of the second embodiment. For example, the emitter E' and the collector C' of the HBT 200 of the present embodiment are formed relatively thin, e.g., less than 5 nm, whereas the thickness of the emitter E and the collector C of the HBT 100 of the first embodiment are formed relatively thick, e.g., greater than 10 nm.

The emitter E' of the HBT 200 of the present embodiment is a continuous layer that conformally covers and contacts the first vertical sidewall 52 of the intrinsic base 50, conformally covers and contacts the first sidewall 41 of the first seed layer 40, the top surface 42 of the first seed layer 40, the second sidewall 43 of the first seed layer 40, partially fills in the first gap 58 between the first seed layer 40 and the first vertical sidewall 52 of the intrinsic base 50, and covers and contacts a first sidewall of the trench isolation structure 102. In addition, an upper surface of the emitter E' may also extend higher than an uppermost surface of the intrinsic base 50 and an uppermost surface of the trench isolation structure 102, and the emitter E' may also contact a first lower portion of the first insulating spacer 70 and a first lower portion of the second insulating spacer 72.

The collector C' of the HBT 200 of the present embodiment is a continuous layer that conformally covers and contacts the second vertical sidewall 54 of the intrinsic base 50, conformally covers and contacts the first sidewall 45 of the second seed layer 44, the top surface 46 of the second seed layer 44, the second sidewall 47 of the second seed layer 44, partially fills in the second gap 59 between the second seed layer 44 and the second vertical sidewall 54 of the intrinsic base 50, and covers and contacts a second sidewall of the trench isolation structure 102. In addition, an upper surface of the collector C' may also extend higher than an uppermost surface of the intrinsic base 50 and an uppermost surface of the trench isolation structure 102, and the collector C' may also contact a second lower portion of the first insulating spacer 70 and a second lower portion of the second insulating spacer 72.

Accordingly, the method for forming the HBT 200 of the present embodiment is essentially the same as the method for forming the HBT 100 of the first embodiment, except that in forming the emitter E' and the collector C' of the present embodiment, a shorter growth time is used in the SEG process for epitaxially growing the emitter E' and collector C' than the growth time used to form the emitter E and the collector C of the HBT 100 of the first embodiment. Other than the difference mentioned above, all of the other processes, materials and conditions in forming the HBT 200 of the present embodiment maybe the same as those used in the method of forming the HBT 100 of the first embodiment.

With the above-mentioned methods of exemplary embodiments of the present application, substantially the entire trench of a trench isolation structure of an essentially limitless size may be horizontally filled by the combination of the first seed layer 40, the emitter E or E', the second seed layer 44 and the collector C or C' in forming a semiconductor structure such as, for example, an HBT. As discussed above, conventional HBT fabrication processes which, for example, epitaxially grow the emitter and collector only from a lateral sidewall of the intrinsic base may have significant limitations associated therewith such as the inability to horizontally fill a trench having a width greater than 20 nm with the epitaxially grown emitter and collector. This inability by conventional art HBT fabrication processes to be able to horizontally fill a trench having a width greater than 20 nm with the emitter and the collector may result in design limitations for circuit applications such as, for example, designers having to place the metal contacts for both the emitter and the collector in very close proximity (e.g., within about metal wire pitch) to the intrinsic base.

Another limitation with conventional HBT fabrication processes is that due to their inability to horizontally fill the trenches of trench isolation structures of the HBT having a width of greater than 20 nm with the epitaxially grown emitter and collector is that the horizontal emitter/collector area formed by these conventional processes may be too small for being able to use an electrical probe to make electrical contact with the emitter, the collector and the intrinsic base to test out the semiconductor device.

In contrast, in exemplary embodiments of the present application, the combination of the first seed layer 40, the second seed layer 44, the emitter E or E', and the collector C or C', as discussed herein, may horizontally fill trench isolation structures 102 having widths greater than 20 nm and well beyond to horizontally fill trenches of the trench isolation structures of essentially limitless widths. Consequently, exemplary embodiments of the present application allow the metal contacts for the emitter E or E' and the metal contacts for the collector C or C' to be located conveniently and arbitrarily away from the intrinsic base 50 and also provide a horizontal emitter/collector area of sufficient size for being able to use an electric probe to test the semiconductor device.

While the present application has been described in terms of specific embodiments, it is evident in view of the foregoing description that numerous alternatives, modifications and variations will be apparent to those skilled in the art. Each of the various embodiments of the present application can be implemented alone, or in combination with any other embodiments of the present application unless expressly disclosed otherwise or otherwise impossible as would be known to one of ordinary skill in the art. Accordingly, the present application is intended to encompass all such alternatives, modifications and variations which fall within the scope and spirit of the present application and the following claims.

What is claimed is:

1. A semiconductor structure comprising:
a first seed layer and a second seed layer spaced apart from each other and on an insulator layer, wherein the first seed layer and the second seed layer have a doping of a first conductivity type;
an intrinsic base located between the first seed layer and the second seed layer and on the insulator layer, wherein the intrinsic base is spaced apart from the first seed layer by a first gap and is spaced apart from the second seed layer by a second gap, wherein the intrinsic base has a doping of the first conductivity type, and wherein the intrinsic base, the first seed layer and the second seed layer include a semiconductor material;
an emitter covering the first seed layer, and located in the first gap and on a first vertical surface of the intrinsic base;
a collector covering the second seed layer, and located in the second gap and on a second vertical surface of the intrinsic base that is opposite to the first vertical surface of the intrinsic base, wherein the emitter and the collector include a semiconductor material and having a doping of a second conductivity type opposite to the first conductivity type; and
an extrinsic base located on a top surface of the intrinsic base, wherein the intrinsic base contacts the emitter, the collector and the extrinsic base, and wherein the intrinsic base has an energy band gap less than an energy band gap of the emitter and an energy band gap of the collector.

2. The semiconductor structure of claim 1, further comprising:
a trench isolation structure located on the insulator layer and laterally surrounding and contacting the first seed layer, the emitter, the second seed layer and the collector, wherein the first seed layer, the second seed layer and the intrinsic base include a semiconductor material comprising Si, Ge, SiGe, SiGeC, SiC, or a combination thereof, wherein the emitter and the collector include a semiconductor material comprising Si, Ge, SiGe, SiGeC, SiC, or a combination thereof, and wherein the extrinsic base has a doping of the first conductivity type.

3. The semiconductor structure of claim 2, further comprising a first insulating spacer laterally surrounding and contacting the extrinsic base and located on a top surface of the intrinsic base; and a second insulating spacer laterally surrounding and contacting the first insulating spacer, and wherein the first insulating spacer contacts the emitter and the collector and wherein the second insulating spacer contacts the emitter and the collector.

4. The semiconductor structure of claim 2, wherein the first gap has a V-shape which is defined by a slanted sidewall of the first seed layer, a first portion of a top surface of the insulator layer and the first vertical surface of the intrinsic base, and wherein the second gap has a V-shape which is defined by a slanted sidewall of the second seed layer, a second portion of the top surface of the insulator layer and the second vertical surface of the intrinsic base.

5. The semiconductor structure of claim 2, wherein the emitter covers and contacts the first vertical surface of the intrinsic base, covers and contacts a first sidewall of the first seed layer, a top surface of the first seed layer, a second sidewall of the first seed layer, fills in the first gap between the first seed layer and the first vertical surface of the intrinsic base, and covers and contacts a first sidewall of the trench isolation structure, and
wherein the collector covers and contacts the second vertical surface of the intrinsic base, covers and contacts a first sidewall of the second seed layer, a top surface of the second seed layer, a second sidewall of the second seed layer, fills in the second gap between the second seed layer and the second vertical surface of the intrinsic base, and covers and contacts a second sidewall of the trench isolation structure.

6. The semiconductor structure of claim 2, wherein the emitter conformally covers and contacts the first vertical surface of the intrinsic base, conformally covers and contacts a first sidewall of the first seed layer, a top surface of the first seed layer, a second sidewall of the first seed layer, partially fills in the first gap between the first seed layer and the first vertical surface of the intrinsic base, and covers and contacts a first sidewall of the trench isolation structure, and
wherein the collector conformally covers and contacts the second vertical surface of the intrinsic base, conformally covers and contacts a first sidewall of the second seed layer, a top surface of the second seed layer, a second sidewall of the second seed layer, partially fills in the second gap between the second seed layer and the second vertical surface of the intrinsic base, and covers and contacts a second sidewall of the trench isolation structure.

* * * * *